United States Patent [19]

Willis et al.

[11] 4,021,898

[45] May 10, 1977

[54] METHOD OF ADJUSTING THE FREQUENCY OF VIBRATION OF PIEZOELECTRIC RESONATORS

[75] Inventors: Alan E. Willis; Jack Schwarzschild, both of Stamford, Conn.

[73] Assignee: Timex Corporation, Waterbury, Conn.

[22] Filed: May 20, 1976

[21] Appl. No.: 688,458

[52] U.S. Cl. .................. 29/25.35; 219/121 LM; 310/8.9
[51] Int. Cl.[2] ........................... H01L 41/22
[58] Field of Search ............... 29/25.35, 593; 219/121 L, 121 LM; 310/8.9; 51/319; 58/23 AC, 23 TF

[56] References Cited

UNITED STATES PATENTS

| 2,877,338 | 3/1959 | Berge | 29/25.35 X |
| 3,691,720 | 9/1972 | Anderson et al. | 53/91 |

*Primary Examiner*—Carl E. Hall
*Attorney, Agent, or Firm*—Lawrence Hager

[57] ABSTRACT

A method of trimming or tuning the frequency of vibration of a piezoelectric resonator comprising varying the ambient gas pressure within an unsealed resonator can until the desired frequency is obtained. The can is then sealed at the desired pressure, and thereby maintains the desired resonant frequency.

2 Claims, 2 Drawing Figures

METHOD OF ADJUSTING THE FREQUENCY OF VIBRATION OF PIEZOELECTRIC RESONATORS

BACKGROUND OF THE INVENTION

The present invention relates to a method of adjusting the resonant frequency of a piezoelectric resonator.

Certain crystals, such as quartz crystals, have the ability to generate a voltage when a mechanical force is applied thereto. Conversely, such crystals also have the ability to deform when a voltage is applied to the crystal. These crystals are commonly referred to as piezoelectric crystals.

Piezoelectric crystals have highly stable frequency characteristics, and, therefore, they are frequently used as resonators in oscillator circuits.

Quartz crystal micro-resonators can be advantageously employed as the time standard of a timepiece. The small size permits the micro-resonator to be housed together with a micro-electronic oscillator, frequency divider and driver circuitry in a package sufficiently small to fit in a wristwatch.

Although quartz crystal micro-resonators can be batch fabricated to frequencies relatively close to a desired value, it is necessary to tune or trim each crystal individually to obtain an exact resonant frequency.

For example, quartz crystal resonators can be cut by known manufacturing procedures to an accuracy of plus or minus 1 Hz which is satisfactory for many purposes. However, in applications such as quartz watches, it is essential that the resonant frequency of the quartz resonator be a predetermined frequency to permit accurate timekeeping.

Prior art processes for tuning crystal resonators are generally too slow, expensive and inaccurate.

For example, one prior art process includes manually rubbing a crystal plate against a sheet of abrasive paper, cleaning the crystal plate and then measuring the resonant frequency of the resonator. This process is most unacceptable since it involves a trial and error process which requires skilled labor.

Another known method involves using a stream of abrasive particles or powder to reduce the length of the crystal plate. The length reduction operation is automatically controlled. However, this technique is little more than automating the above mentioned trial and error process of using an abrasive to reduce the size of the crystal plate. This process is undesirable since it permits unidirectional tuning only, i.e., increasing the resonant frequency by reducing crystal size and does not enable or permit the lowering of the resonant frequency, and because the tuning is effected prior to mounting of the crystal in its can receptacle.

A still further prior art method of tuning a crystal resonator involves mounting the resonator in a package having a transparent window region through which the crystal micro-resonator is tuned by use of a laser beam to remove portions of (metal) weights formed or provided on the tine ends of a tuning fork type crystal resonator. The process is undesirable since it too enables unidirectional tuning only and because it requires the added and expensive process of providing weights on tuning fork tine ends and a transparent window region in the crystal container.

The prior art includes patents of Beaver U.S. Pat. No. 3,808,752, Staudte U.S. Pat. No. 3,766,616, Keeler U.S. Pat. No. 3,803,828, Zemla U.S. Pat. No. 3,046,460, Wiley U.S. Pat. No. 3,306,030, Nakai U.S. Pat. No. 3,469,389, Hansell U.S. Pat. No. 1,874,982, Assmus U.S. Pat. No. 3,805,509, Hund U.S. Pat. No. 1,886,814 and Oguchi U.S. Pat. No. 3,906,260. These patents are mentioned as being representative of the prior art and other pertinent patents may exist. None of the above cited patents are deemed to effect the patentability of the claimed invention.

SUMMARY OF THE INVENTION

In one embodiment of the invention, the crystal micro-resonator is disposed in a hermetically sealed metal container. The crystal container package is then placed into a vacuum and pressure tight chamber. Electrical connections to supply power and to bring out signals from the crystal are made through a hermetic feed-through in the chamber. The chamber is provided with a transparent window portion. If the resonant frequency of the crystal requires tuning, a small hole is formed in the container by a laser beam which if focused, through the window of the chamber, on the crystal container. The pressure of the air or other gas within the chamber and, by means of the container hole, within the crystal container is varied causing the resonant frequency of the crystal to change. The chamber pressure is incrementally changed, positively or negatively, until the resonant frequency of the crystal is at the desired rate. The crystal container is then hermetically sealed at this pressure, by causing the laser to weld shut the hole previously formed in the container, causing the desired resonant frequency of the crystal to be maintained within the pressure tight crystal container.

Accordingly, an object of the present invention is to provide a new and improved method of adjusting the frequency of vibration of piezoelectric resonators.

A further object of the present invention is to provide a new and improved method of fine tuning the resonant frequency of quartz crystal micro-resonators of the type used in timepieces.

A still further object of the present invention is to provide a method and process for bidirectionally tuning piezoelectric resonators.

Another object of the present invention is to provide a new and improved method and process for automatic tuning of the resonant frequency of piezoelectric resonators without piezoelectric resonator mass reduction or removal.

A still further object of the present invention is to provide a new and improved method and process of automatically adjusting the atmospheric pressure enclosed in a piezoelectric resonator can package for tuning the frequency of the piezoelectric resonator.

A still further object of the present invention is to provide a new and improved method and process of adjusting the frequency of a resonator having a frequency above or below a desired frequency.

BRIEF DESCRIPTION OF THE DRAWINGS

Other objectives and advantages of the present invention will be apparent from the following detailed description of the preferred embodiment of the present invention, the description being taken in conjunction with the accompanying drawing.

DESCRIPTION OF THE PREFERRED EMBODIMENT

Figure 1:
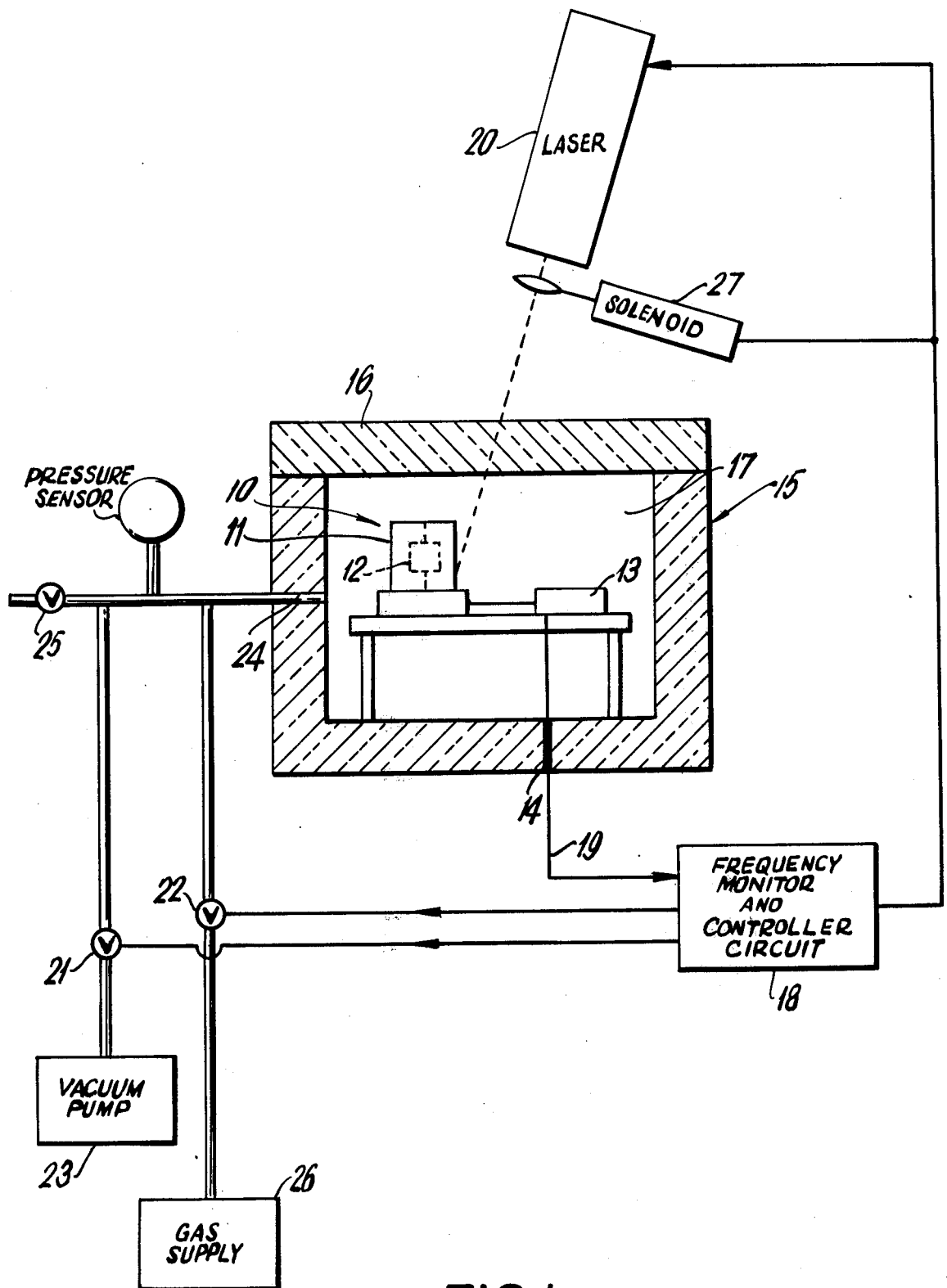
FIG. 1 is a diagrammatic view illustrating automatic atmospheric pressure tuning of a packaged micro-resonator.

The following detailed description is of the best presently contemplated embodiment or method of carrying out the invention. This description is not to be taken in a limiting sense, but is made merely for the purpose of illustrating the general principles of the invention since the scope of the invention is best defined by the appended claims.

In FIG. 1 there is shown a package 10 comprising, for example, a metal container or can 11 which is capable of being hermetically sealed and a quartz crystal micro-resonator 12 disposed therein as described in the above mentioned U.S. patents. The micro-resonator 12 may have any desired configuration and is mounted by conventional means such as a pedestal.

Since the shape and mounting of the resonator does not form a part of the invention and conventional means can be used, exhaustive details thereof are omitted to avoid prolixity.

FIG. 1 illustrates the manner in which a micro-resonator 12 mounted within a container or can 11 may be tuned automatically by varying the atmospheric pressure within the can 11. The micro-resonator 12 is interconnected to function as the frequency reference or source in an oscillator circuit. The oscillator circuit, for example, is contained within a package 13 which may also contain countdown or divider circuits, amplifiers or other circuitry useful in conjunction with the micro-resonator 12. Electrical connections to supply power and to bring out signals from the micro-resonator 12 and/or the electronic package 13 are made through a hermetic feed-through 14 in the chamber 15 which when closed is pressure tight. The chamber 15 may be provided with transparent window portions 16, 17. The micro-resonator and can package 10 are place within the chamber 15 and, after being properly mounted therein and electrically connected to the electronic circuitry 13, the chamber is hermetically (pressure tight) sealed.

With the micro-resonator 12 in operation, the electronic circuitry 13 will provide an output signal, via line 19, at a frequency determined in part by the pressure of the air or other gas within the package 10 which, therefore, envelops the micro-resonator. If the micro-resonator frequency is above or below the desired frequency, the frequency monitor and controller device 18 provides appropriate signals to a laser 20 to cause a small opening or hole to be formed in the metal can 11. The frequency monitor and controller device 18, either simultaneously or after the laser 20 forms the hole in the metal can 11, also provides a signal to an electrically controlled valve 21 or 22. The valves 21, 22 are connected respectively to, for example, a vacuum pump 23 and a source 26 of compressed gas or air having a relatively high pressure.

If the frequency of the micro-resonator 12 is determined to be lower than the desired frequency, i.e., a standard which is compared to the micro-resonator 12 frequency, valve 21 is controlled to cause the ambient pressure within both the sealed chamber 15 and the package 10, by means of vacuum pump 23, to be reduced. As the pressure is reduced, the frequency of the micro-resonator increases. This process is continued until the frequency of the micro-resonator 12 is at the desired higher frequency.

If the frequency of the micro-resonator 12 is determined to be higher than the desired rate, valve 22 is controlled, by the frequence monitor and controller device 18, to cause the ambient pressure within both the sealed chamber 15 and the package 10, by means of a source of high pressure gas such as compressed gas, to be increased. This process is continued until the frequency of the micro-resonator 12 is at the desired lower frequency. Thus, the pressure within the sealed chamber may be controlled and monitored by means of a chamber inlet opening 24, bleed valve 25, pressure gauge, electrically controlled valves 21, 22, source of compressed gas 26, and a vacuum pump 23.

Therefore, the frequency of the micro-resonator 12 can be increased or decreased by varying the pressure on the micro-resonator. For example, it was observed that the frequency of a typical micro-resonator such as a quartz crystal used as a time base in wristwatches increased by about 300 ppm (parts per million) as the pressure was reduced from an ambient pressure of approximately 15 psi (pounds per square inch) to a pressure near vacuum, i.e., approaching zero psi.

At the desired resonant frequency of the resonator, the frequency monitor and controller circuit 18 provides appropriate signals to the laser 20 and a focusing unit 27 to cause the laser to weld shut or close the hole previously formed in the metal container 11 thereby hermetically sealing the container at the precise internal pressure to maintain the desired frequency of the micro-resonator.

Although automatically controlled laser and gas pressure tuning are illustrated, this is not a requirement of the invention; the laser and gas pressure may be under manual control. Therefore, and since conventional servomechanism techniques/devices can be used, exhaustive details of the frequency monitor (or meter) and controller circuit are omitted to avoid prolixity.

While there has been shown what is considered to be the preferred embodiment of the invention, it is desired to secure in the appended claims all modifications as fall within the true spirit and scope of the invention. Some obvious modifications which are intended to be included within the scope of the claimed invention include, for example, performing the described process manually and/or the use of crystal containers having preformed holes therein so that the operation would involve only sealing the crystal container or can after the resonator is tuned.

We claim:

1. A process for tuning a micro-resonator which is mounted within a hermetically sealed container comprising:
    disposing said container within a pressure tight chamber;
    operating said micro-resonator as the frequency standard of an oscillator circuit;
    providing an opening in said container to permit passage of gas into and out of said container;
    varying the ambient gas pressure within said chamber and said container to tune said operating micro-resonator; and
    sealing said opening in said container hermetically to maintain said micro-resonator under the tuning ambient gas pressure within said container.

2. A process for tuning a micro-resonator which is mounted within a hermetically sealed container comprising:

disposing said container within a chamber having at least a portion which is transparent;
closing said chamber so as to be pressure tight;
operating said micro-resonator as the frequency standard of an oscillator circuit;
utilizing a laser beam external to said chamber to project a first beam through said transparent portion for forming an opening in said container;
varying the atmospheric pressure within said chamber and said container to tune said operating micro-resonator; and
utilizing said laser beam to project a second beam for hermetically sealing said opening to maintain said micro-resonator under the influence of the tuning atmospheric pressure within said container.

* * * * *